United States Patent
Sicard et al.

(10) Patent No.: US 9,590,618 B2
(45) Date of Patent: Mar. 7, 2017

(54) START-UP TECHNIQUE AND SYSTEM FOR A SELF-POWERED GATE DRIVE CIRCUIT

(71) Applicants: Thierry Sicard, Auzeville Tolosane (FR); Philippe Perruchoud, Tournefeuille (FR)

(72) Inventors: Thierry Sicard, Auzeville Tolosane (FR); Philippe Perruchoud, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/435,199

(22) PCT Filed: Oct. 31, 2012

(86) PCT No.: PCT/IB2012/002655
§ 371 (c)(1),
(2) Date: Apr. 13, 2015

(87) PCT Pub. No.: WO2014/068354
PCT Pub. Date: May 8, 2014

(65) Prior Publication Data
US 2015/0280705 A1    Oct. 1, 2015

(51) Int. Cl.
*H03K 17/567* (2006.01)
*H02M 1/08* (2006.01)
(Continued)

(52) U.S. Cl.
CPC .......... *H03K 17/567* (2013.01); *H02M 1/08* (2013.01); *H02M 1/36* (2013.01); *H03K 17/0828* (2013.01); *H03K 2217/0081* (2013.01)

(58) Field of Classification Search
CPC   H02M 1/00; H02M 1/08; H02M 1/36; H03K 17/00; H03K 17/04126;
(Continued)

(56) References Cited

U.S. PATENT DOCUMENTS

2012/0327692 A1* 12/2012 Cantoro .............. H02M 3/3387
                                                         363/21.03
2013/0049816 A1*  2/2013 Cioci .................... H03K 17/567
                                                         327/109

FOREIGN PATENT DOCUMENTS

DE      102005012151 B3    6/2006
WO      2014/068353 A1     5/2014

OTHER PUBLICATIONS

Wang H et al: "A Self-Powered Resonant Gate Driver for High Power MOSFET Modules", Applied Power Electronics Conference and Exposition, 2006. APEC '06. Twenty-First Annual IEEE Mar. 19, 2006, Piscataway, NJ, USA, IEEE, Piscataway, NJ, USA, Mar. 19, 2006 (Mar. 19, 2006), pp. 183-188.

(Continued)

*Primary Examiner* — Lincoln Donovan
*Assistant Examiner* — David Mattison
(74) *Attorney, Agent, or Firm* — Charlene R. Jacobsen

(57) ABSTRACT

A start-up method for a self-powered gate drive circuit driving a power transistor gate. The method comprises charging, with a single-supply voltage, a first supply capacitor of a first gate drive circuit; switching on a first power transistor by applying a current supplied by a discharge of the first supply capacitor of the first gate drive circuit to the gate of the first power transistor; charging a second supply capacitor of the first gate drive circuit using an output signal from the first power transistor; and re-charging the first supply capacitor by applying a current supplied by a discharge of the second supply capacitor to the first capacitor.

8 Claims, 9 Drawing Sheets

(51) Int. Cl.
*H02M 1/36* (2007.01)
*H03K 17/082* (2006.01)

(58) Field of Classification Search
CPC ............. H03K 17/063; H03K 17/0826; H03K 17/0828; H03K 17/567; H03K 17/601; H03K 2217/00; H03K 2217/0036; H03K 2217/0081
USPC .......................................................... 327/109
See application file for complete search history.

(56) References Cited

OTHER PUBLICATIONS

International Search Report and Written Opinion correlating to PCT/IB2012/002655 dated Aug. 6, 2013.

* cited by examiner

START-UP TECHNIQUE AND SYSTEM FOR A SELF-POWERED GATE DRIVE CIRCUIT

FIELD OF THE INVENTION

This invention relates to a start-up technique and system for a self-powered gate drive circuit driving a power transistor gate.

BACKGROUND OF THE INVENTION

Availability of affordable, reliable power transistors (e.g., power MOSFETs and IGBTs) and modules may be important design goals for electric vehicles, hybrid cars, and other power applications. Typically, a gate driver may be provided to drive a power transistor gate. In the case of insulated-gate bipolar transistors "IGBTs", a dual power supply may power the gate driver for facilitating switching an IGBT on and off.

SUMMARY OF THE INVENTION

The present invention provides a technique and system for a self-powered gate drive circuit driving a power transistor gate as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

As used herein, an "IGBT module" refers to a module housing at least one IGBT, but may also include modules with several IGBTs in parallel or in a bridge topology. "Gate capacitance" or "gate capacitor" refers to the equivalent capacitance that may be charged and discharged within a power transistor gate in order to switch the power transistor on and off. "Self-supplied gate drive circuit" refers to a gate drive circuit that may power itself by drawing current and/or voltage from an output of a power transistor. A self-supplied gate drive circuit may, however, draw on an external power supply during a Power-on Rest (PoR) operation. A "start-up sequence", "start-up method", and "start-up operation" refer to the initial processes that a self-supplied gate drive circuit may undergo before "normal operation". For example, a PoR operation may be the initial steps of a start-up sequence or start-up method.

Figure 1:
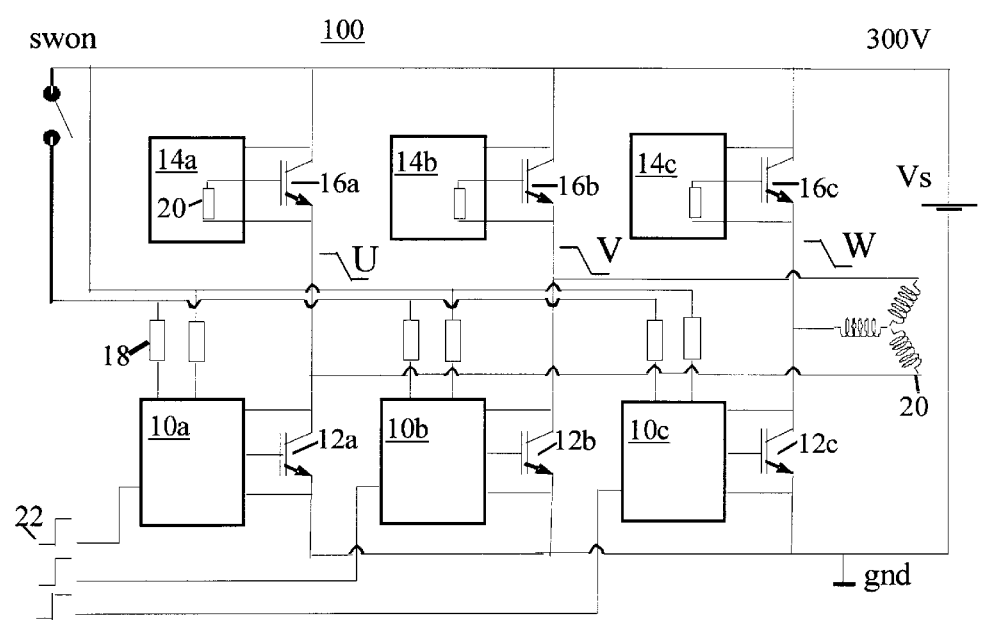
FIG. 1 schematically shows an example of an embodiment of an IGBT module.

FIG. 1 schematically shows an example of an embodiment of IGBT module 100 connected to single supply voltage Vs and inductor wye 20. In particular, gate drive circuits 10a-c and IGBTs 12a-c may form a low side of a half-bridge topology, and gate drive circuits 14a-c and IGBTs 16a-c may form a high side of the half bridge topology. Gate drive circuits 10a-c and 14a-c or a portion thereof may be an IC.

Another advantage, as will be explained in further detail below, may be gate drive circuits 10a-c and 14a-c being self-powered. For example, gate drive circuits 10a-c and 14a-c may draw current and/or voltage from an IGBT collector and use the current/voltage to power the gate drive circuit. A PoR operation may be utilized to "pre-charge" gate drive circuits 10a-c and 14a-c although the gate drive circuits may be typically powered by an IGBT collector output. For example, switch swon may be switched on for a short period as part of a PoR operation to pre-charge, for example, a capacitor that supplies current to gate drive circuits 10a-c. Following the PoR operation, gate drive circuits 10a-c may be self-powered by drawing output signal U produced by IGBTs 12a and 16a; output signal V may be produced by IGBTs 12b and 16b; and output signal W may be produced by IGBTs 12c and 16c. Output signals U, V, and W are outputted into inductor wye 20. Although a half-bridge topology producing three-phase power may be shown, the present invention may be implemented in other topologies, including single and dual modules, full and other bridge inverters, chopper modules, and "Smart" IGBT modules (i.e., microprocessor-controlled modules). Further, the present invention may be implemented in producing DC or single or two-phase power.

External resistors 18 may be used to inject current into gate drive circuits 10a-c. Internal resistors 20 prevent parasitic turn on in IGBTs 16a-c. That is, internal resistors 20 provide a passive low impedance to block current resulting from a high dVCE/dt of, for example, IGBTs 10a-c.

Control signals 22 may control an output of gate drive circuits 10a-c and may control an output of gate drive circuits 14a-c. Control signal 22 may be provided by a control module (not shown), which may be a microprocessor. IGBT module 100 and a control module may form a power transistor system. Ground gnd may be a power ground.

IGBT modules and gate drive circuits of the present invention do not require a dual power supply, which may be usually implemented as a high-voltage transformer, but may be powered by a single power supply (e.g., Vs), as shown in FIG. 1. This may be a significant advantage in both the cost and complexity of a power transistor device and associated electronics.

Figure 7:
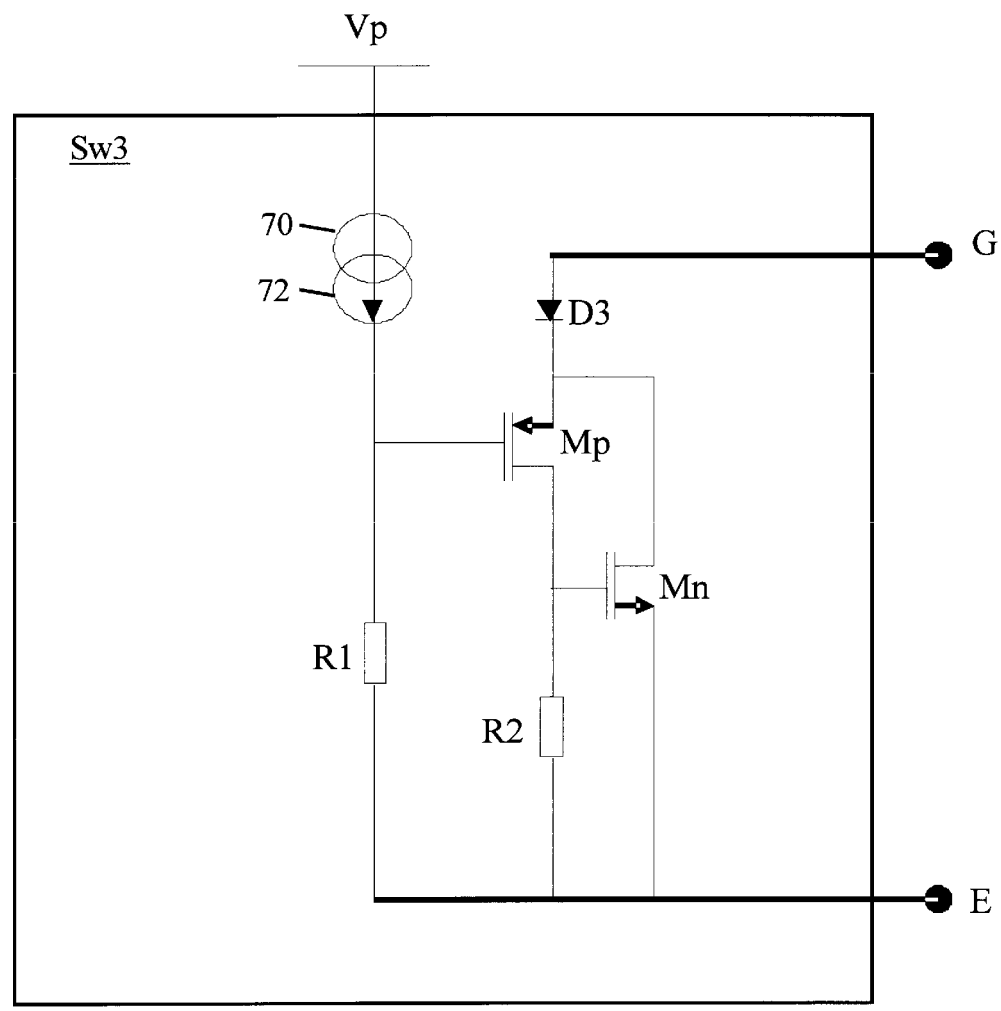
FIG. 7 schematically shows a detailed embodiment of switch sw3 shown in FIG. 2.

The start-up sequence may provide a low dVCE/dt to avoid parasitic turn on. As shown in FIG. 7, a passive pull down circuit may allow for a low dVCE/dt during a start-up sequence.

When each output signal U, V, and W is low after a PoR operation, high-side drivers 14a-c may then be electrically coupled to voltage Vs, perform a PoR operation, and be ready for normal operation. The PoR operation of drivers 14a-c may have a low dVCE/dt.

Figure 2:
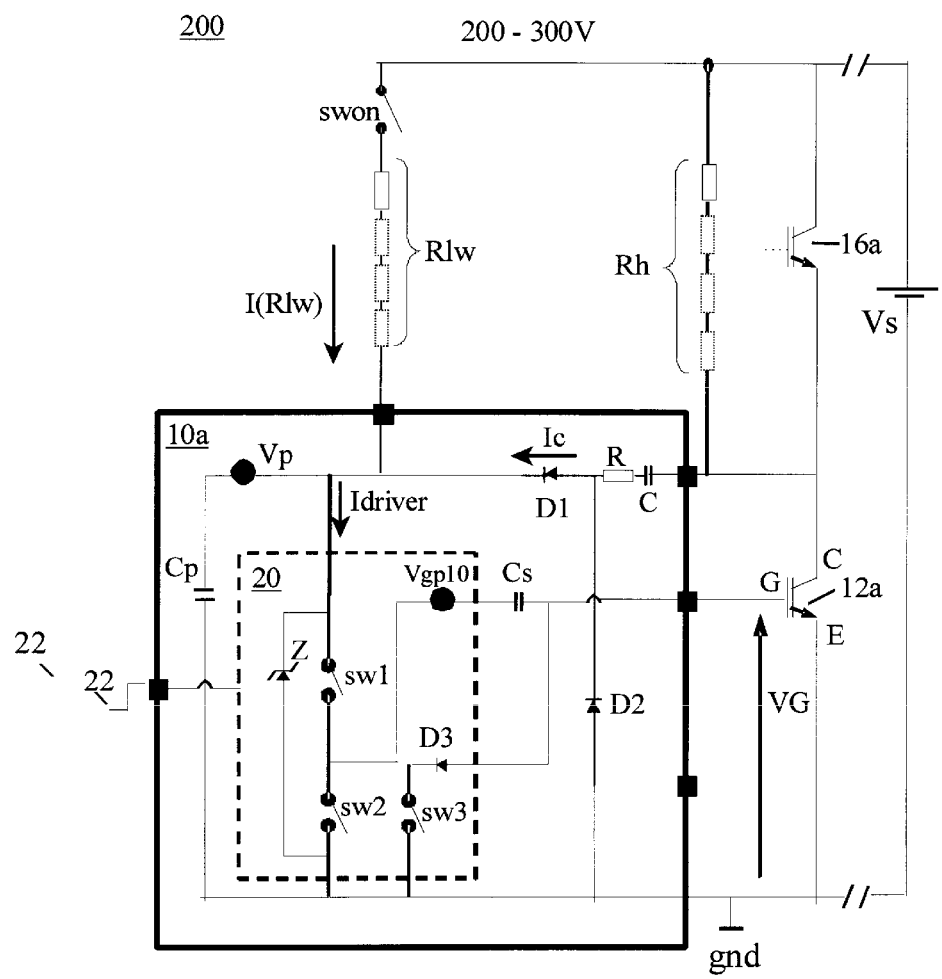
FIG. 2 schematically shows a further-detailed example of an embodiment of an IGBT module.

FIG. 2 schematically shows a further-detailed example of an embodiment of IGBT module 200 connected to voltage Vs. The identification of the features shared with FIG. 1 may not be repeated in describing FIG. 2. Further, the upper half circuit may be a simplified representation showing only IGBT 16a. Gate drive circuit 14a may include the same or similar circuitry as shown for gate drive circuit 10a.

Gate drive circuit 10a may include gate driver 20. Gate driver 20 may include switches sw1 and sw2 connected to Zener diode Z. Gate driver 20 may be an IC.

The topography of circuit 100 allows gate drive 10 to be both self-supplied and driven with a single voltage supply provided at node Vp without the need of an additional negative supply to discharge gate capacitance. In alternative embodiments, the single voltage supply may be a negative supply.

One problem associated with operating an IGBT may be parasitic turn-on. In particular, a high dV/dt transient created during IGBT turn-off or turn-on may induce a parasitic turn-on (e.g., a gate voltage spike) in another IGBT, which may cause damage or destroy a gate drive circuit.

To explain further, collector C may be electrically coupled to upper IGBT 16a. When turning on IGBT 16a, a voltage change dVCE/dt may occur across IGBT 12. A current may flow through a parasitic capacitor of IGBT 12, a resistance electrically connected to gate G, and an internal gate resistor. This current creates a voltage drop across a resistance electrically connected to gate G. If this voltage exceeds the IGBT gate threshold voltage, a parasitic turn-on occurs.

A technique associated with the prior art includes supplying a negative gate voltage to safely turn-off and block a lower IGBT. In contrast, capacitor Cs, which may be connected in series with gate G, discharges to provide a transient negative supply for IGBT 12a that prevents or ameliorates parasitic turn on. That is, capacitor Cs may be charged and discharged in phase with the gate capacitance.

For example, the serial capacitor Cs may be pre-charged at 10V using sw1. Capacitor cs may have a capacitance value of 10 uF. When sw1 may be active, capacitor Cs and the IGBT gate capacitor are charged at the same time or substantially the same time (e.g., in phase). When sw2 may be active, capacitor Cs and the IGBT gate capacitor may be discharged at the same time, and the potential at gate G may be, for example, −10V for the short time that sw2 may be active. Capacitor Cs may be 100 times larger than the IGBT gate capacitor.

Capacitor Cs may not be a supply capacitor. In such embodiments, capacitor Cs may not be able to maintain a negative DC voltage. Thus, when sw1 may be switched off, and sw2 may be switched on, a transient negative voltage may be applied to gate G by capacitor Cs being electrically coupled to ground. The time constant of capacitor Cs may be configured such that Cs discharges in, for example, 500 microseconds.

Gate drive circuit 10a further includes capacitor Cp, which may have a 10 uF capacitance. In some embodiments, capacitor Cp may act as a power supply in cases where Vs may be disconnected or switched off. Capacitors Cp and Cs may be charged substantially concurrently. Thus, switch sw1 may provide two main functionalities: driving gate G turn on (e.g., raising VG) and pre-charging capacitor Cs. The pre-charge amount may result in a 10V potential across capacitor Cs.

Sw3 maintains a low DC state for gate G. VG gate voltage may be kept at 15V and capacitor voltage VCs (not shown) may be clamped at 10V during DC ON. Gate voltage VG may be kept at 1V across D3 and capacitor voltage VCs may be clamped at 10V during DC OFF. The full charge and discharge of gate G may require discharging the voltage supply (e.g., Cp) by only −ΔQ.

Figure 3:
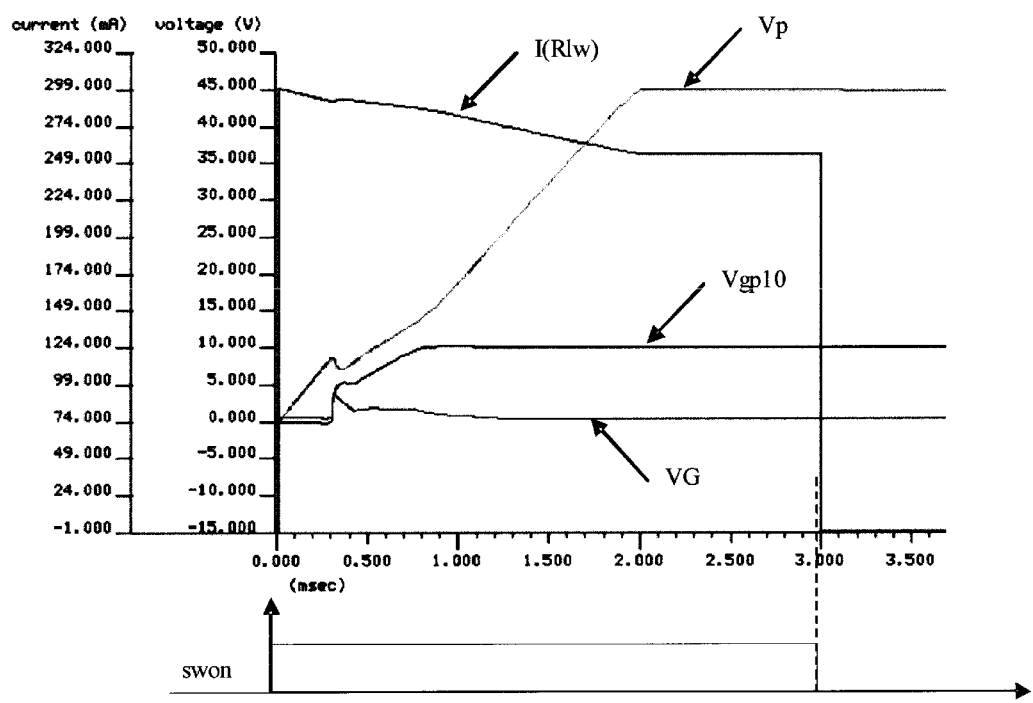
FIG. 3 is a timing chart showing example voltage and current values for the IGBT module of FIG. 2.

FIG. 3 is a timing chart showing example voltage and current values for the IGBT module 200. At 0 seconds, a PoR operation may begin with switch swon being closed. The resistance Rlw may inject about 250 mA in capacitor Cp capacitor from voltage source Vs. Resistance Rlw may include one or more resistors and may equal 1 kΩ.

Further resistors may provide further redundancy to avoid a full short between voltage Vs and gate drive circuit 10a in case a resistor shorts. Further, two or more resistors may lower the power dissipation by each resistor. Resistance Rh may equal 100 kΩ, and, in some embodiments, may be always connected so to bring more than the quiescent current of an IGBT gate driver in an off or pre-PoR mode. Resistance Rh may also be implemented with one or more resistors.

Capacitor Cp may be charged in 2 ms up to the Vp clamped voltage. During Vp ramp up, switch sw1 may be a follower, and thus switches on and causes capacitor Cs to charge up to 10V. Switch sw3 keeps Vg low. At 3 seconds, switch swon may be opened and the PoR operation may be complete.

Switch swon may be closed for few milliseconds to quickly charge capacitor Cp up to, for example, 35V. Rlw may have a total resistance of 1 kΩ and allows a 10 uF capacitor to fully charge in a few milliseconds. In some embodiments, capacitor Cs may be charged substantially concurrently with capacitor Cp during a PoR operation.

Gate drive circuit 10a may operate as a self-supplied driver by drawing power from IGBT 12a during a start-up sequence and/or "normal" operation and only drawing power from Vs during a PoR operation. To explain further, sometime after capacitor Cp may be charged by Vs, gate drive circuit 10a may receive a "turn-on" message to drive IGBT 12a "on" (e.g., in an a conducting state). Switch sw1 may then close, and capacitor Cp may drive current Idriver, which generates a charge on gate G to turn IGBT 12a on or in a conducting state. Thus, a high-voltage and high-current (e.g., high power) output signal may be emitted from collector C.

Capacitor C may collect a portion of the emitted current to power gate drive circuit 10a. Capacitor C may be a high voltage capacitor having about five times less capacitance than the gate capacitance of IGBT 12a.

Capacitor C may be charged to almost 2V when VCE is low and discharged at Vc-Vp when VCE is at a maximum value. The capacitance of capacitor C may be calculated to send more current than the current consumed by the IGBT gate driver (e.g., Ic>Idriver). When the IGBT 16a is turned on, capacitor C and resistor R may inject current through D1 to re-charge capacitor Cp to be ready for the next cycle.

Excess current supplied by capacitor C may go to the clamp voltage of Zener diode Z. Diode D2 may allow current to flow from ground during a charging phase of capacitor C.

Figure 4:
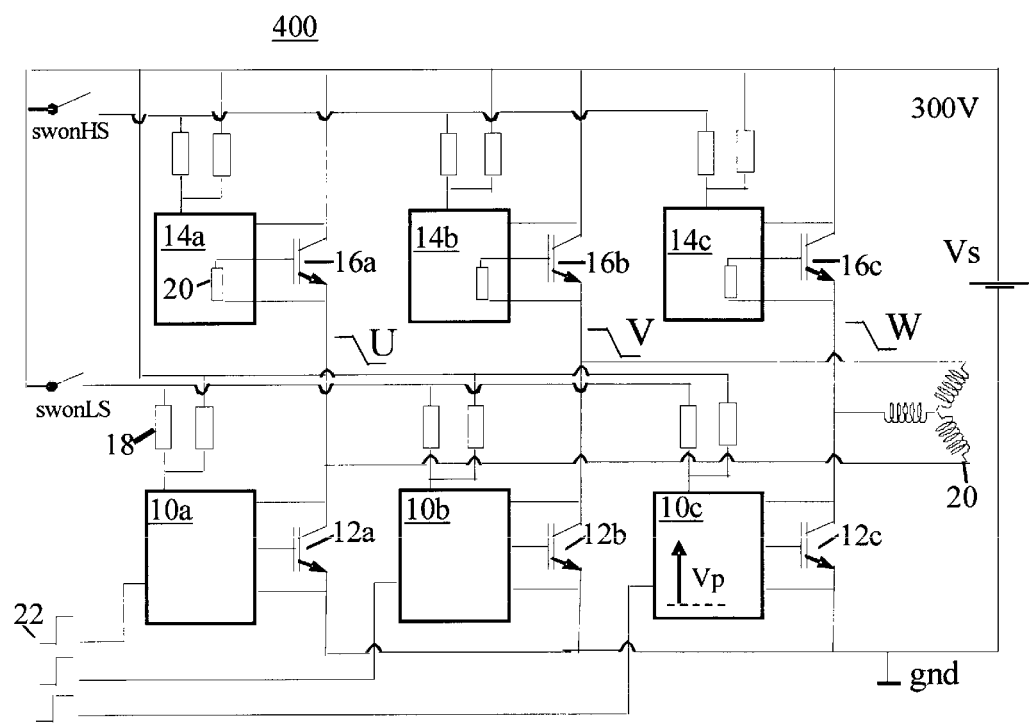
FIG. 4 schematically shows another example of an embodiment of an IGBT module.
Figure 5:
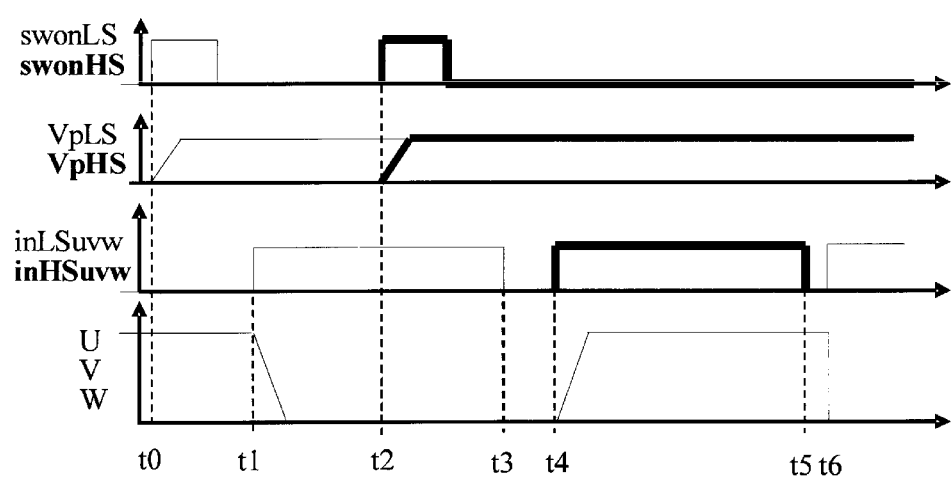
FIG. 5 is a timing diagram for the IGBT module of FIG. 4.

FIG. 4 schematically shows another example of an embodiment of IGBT module 400 connected single-supply voltage Vs. The identification of the features shared with FIG. 1 may not be repeated in describing FIG. 4. FIG. 5 is a timing diagram for IGBT module 400. IGBT module 400 may further include switches swonHS and swonLS. Node Vp of FIG. 4 may correspond to node Vp of FIG. 2.

Referring to the timing diagram of FIG. 5, the bolded signals lines represent the corresponding high-side signals, and the non-bolded signals represent the corresponding low-side signals. Signals U, V, and W of FIG. 5 represent the output signals U, V, and W of FIG. 4, independent of whether it may be the low-side or high-side providing the output signal.

At time t0, switch swonLS may be turned on, for example, for a few milliseconds. Thus, the measured voltage at node Vp of low-side drive circuits 10a-c may be raised. A capacitor may be charged and provide the voltage measured at Vp. A control module may provide a signal to switch swonLS on and off.

At time t1, control signal 22 may be provided to turn on low-side drive circuits 10a-c at the same or substantially the same time (i.e., turned on in phase). Thus, output signals U, V and W may go down in phase. Output signals U, V and W may go down with a low dV/dt only for the first turn on after the PoR operation.

At time t2, each output signal U, V and W may be low, and all the high-side drive circuits 14a-c undergo a PoR operation with switch swonHS being turned on for, for example, a few milliseconds. Thus the measured voltage at node Vp of high-side drive circuits 14a-c may be raised. In some embodiments, a capacitor may be charged to provide the voltage measured at Vp. In some embodiments, a control module provides a signal to switch swonHS on and off.

At time t3, control signal 22 may be provided to turn off low-side drive circuits 10a-c at the same or substantially the same time (i.e., turned off in phase). Thus, capacitor C of FIG. 2 may provide current Ic to recharge capacitor Cp of low-side drive circuits 10a-c so that low-side drive circuits 10a-c are ready to discharge for the next turn-on signal.

At time t4, control signal 22 may be provided to turn on high-side drive circuits 14a-c at the same or substantially the same time (i.e., turned on in phase). Thus, output signals U, V and W may go up. Output signals U, V and W may go up with a low dV/dt only for the first turn on after the PoR. The start-up sequence may end at time t4.

At time t5, control signal 22 may be provided to turn off high-side drive circuits 10a-c at the same or substantially the same time (i.e., turned off in phase). Thus, capacitor C of FIG. 2 may provide current Ic to recharge capacitor Cp of high-side drive circuits 14a-c so that high-side drive circuits 14a-c are ready to discharge for the next turn-on signal.

The start-up sequence may end at time t5. The high-side drive circuits 14a-c may undergo a PoR process before low-side drive circuits 10a-c.

The start-up sequence may further include time t6, wherein all low-side drive circuits 10a-c are turned on. In this case, U, V and W output signals may go low with a high dV/dt. Thus, the start-up process may be complete, and IGBT module 400 may be ready to drive the output signals U, V, and W to drive, for example, a motor.

In embodiments not utilizing a PWM technique, switching between all low-side drive circuits 10a-c on/off and low-side drive circuits 14a-c off/on may be the only available states to avoid both the low-side drive circuits 10a-c and the low-side drive circuits outputting an output signal U, V, or W at the same time. In some embodiments, a 50% PWM technique may be used.

Figure 6:
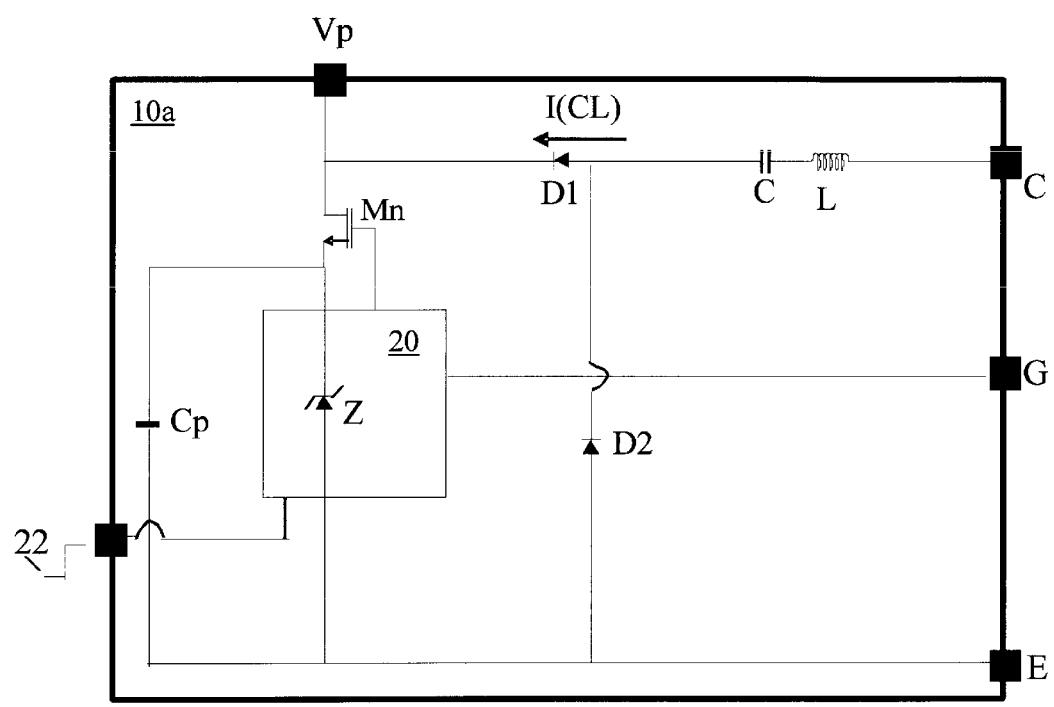
FIG. 6 schematically shows a further-detailed example of an embodiment of a gate drive circuit.

FIG. 6 schematically shows a further-detailed example of an embodiment of gate drive circuit 10a. The identification of the features shared with FIG. 2 may not be repeated in describing FIG. 6. Gate drive circuit 10a further comprises inductor L and nmos Mn.

Inductor L, capacitor C, and diodes D1 and D2 may form a resonant supply driven, for example, by an AC source voltage ranging from 200 to 300V, wherein a duty cycle of 1 to 99% may be possible. In some embodiments, because the gate drive circuit 10a consumption may be constant, the nmos Mn may switch to regulate the power supplied to Cp and gate driver 20. That is, when Mn may be switched off, Mn block current I(CL) and when Mn may be switched on, current may be supplied to capacitor Cp. Excess current may be routed through Zener diode Z. Gate drive circuit 10a may have significantly less power dissipation (e.g., less than 0.2 W) than the resistor R and capacitor C of FIG. 2.

FIG. 7 schematically shows a detailed embodiment of switch sw3 shown in FIG. 2. The identification of the features shared with FIG. 2 may not be repeated in describing FIG. 7. Current source 70 may be the state of the current source before a PoR operation, e.g., the current source 70 may be not active (I=0). Resistors R1 and R2 may force the gate (G) of a power transistor to be at relatively low impedance with nmos Mn and pmos Mp. When I is active with a few hundred uA (e.g., the initial nanoseconds of a PoR operation), the gate of Mp may be pulled up, so that Mp and Mn are off and pull downs do not occur in normal operation (e.g., the next pull down occurs during another PoR operation). Thus, current source 72 may correspond to the initial nanoseconds of a PoR operation. Switch sw3 of FIG. 7 thus allows for a low dVCE/dt during a PoR operation by keeping the gate voltage low.

Figure 8:
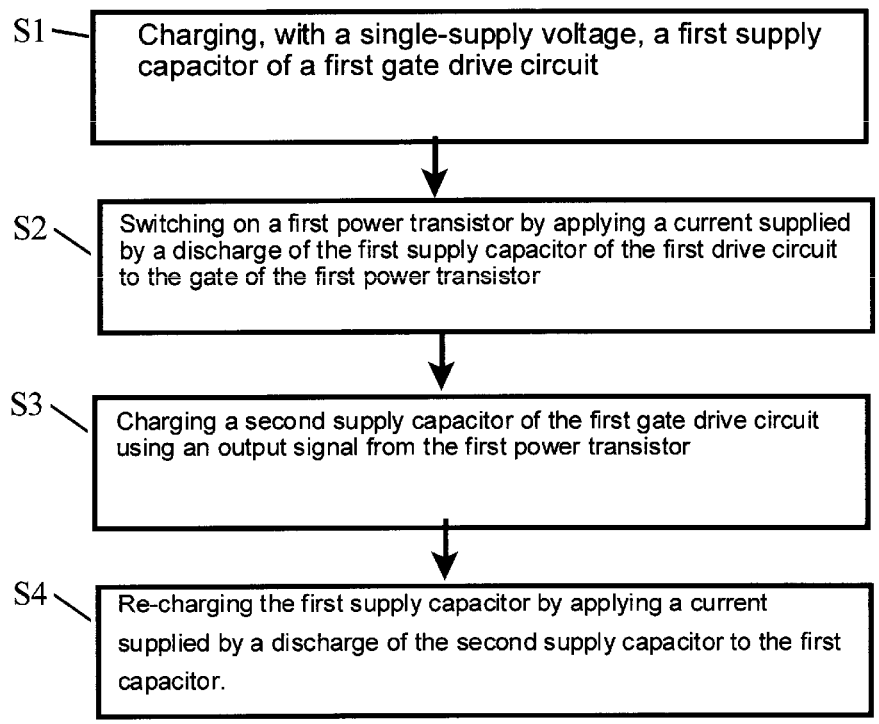
FIG. 8 shows a flow chart of an example embodiment method of starting up a self-powered gate drive circuit.

FIG. 8 shows a flow chart of method 800 for starting up a self-powered gate drive circuit. At step S1, a single-supply voltage charges a first supply capacitor of a first gate drive circuit. At step S2, a first power transistor may be switched on by applying a current supplied by a discharge of the first supply capacitor of the first gate drive circuit to the gate of the first power transistor. At step S3, a second supply capacitor of the first gate drive circuit may be charged using an output signal from the first power transistor. At step S4, the first supply capacitor may be re-charged by applying a current supplied by a discharge of the second supply capacitor to the first capacitor.

Method 800 may further comprise charging a negative transient supply capacitor in series with the gate of the first power transistor by applying the current supplied by the discharge of the first supply capacitor to the negative transient supply capacitor, and switching off the first power transistor by discharging the negative transient supply capacitor.

Method 800 may further comprise electrically coupling both the gate of the first power transistor and a diode electrically coupled to the gate of the first power transistor to a ground, wherein the cathode of the diode may be connected to the ground and the anode may be connected to the gate of the first power transistor.

The first power transistor may be a first IGBT and charging the second supply capacitor of the first IGBT may comprise charging the second supply capacitor of the first IGBT using an output signal outputted from the collector of the first IGBT.

Steps S1 to S4 of method 800 may be used to operate a second self-powered gate drive circuit.

Figure 9:
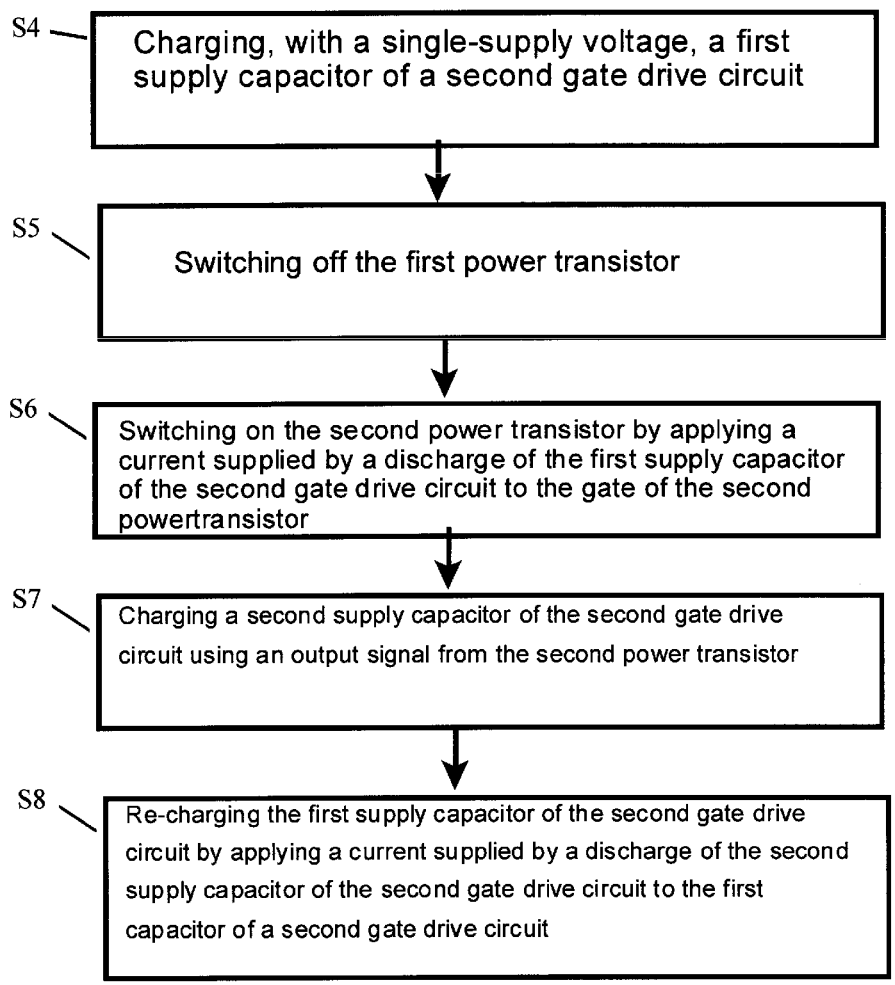
FIG. 9 shows another flow chart of an example embodiment method of starting up a self-powered gate drive circuit.

FIG. 9 shows a flow chart of method 900 for starting up a first and second power transistor that form a bridge topology. Steps S1 to S3 may be the same or similar as the steps of method 800. At step S4, a first supply capacitor of a second self-powered gate drive circuit may be charged with the single-supply voltage. At step S5, the first power transistor may be switched off. At step S6, the second power transistor may be switched on by applying a current supplied by a discharge of the first supply capacitor of the second gate drive circuit to the gate of the second power transistor. At step S7, a second supply capacitor of the second gate drive circuit may be charged using an output signal from the second power transistor. At step S8, the first supply capacitor of the second gate drive circuit may be re-charged by applying a current supplied by a discharge of the second supply capacitor of a second gate drive circuit to the first capacitor of the second gate drive circuit.

The first power transistor may be a first IGBT and the second power transistor may be a second IGBT, wherein charging the second supply capacitor of the first and second IGBTs includes charging the second supply capacitor of the first IGBT using an output signal outputted from the collector of the first IGBT and charging the second supply capacitor of the second IGBT using an output signal outputted from the collector of the second IGBT.

The first IGBT may be a low-side of the bridge topology and the second IGBT may be a high-side of the bridge topology. The single supply voltage may be a positive single supply voltage.

The invention may also be implemented in a computer program for running on a computer circuit, at least including code portions for performing steps of a method according to the invention when run on a programmable apparatus, such as a computer circuit or enabling a programmable apparatus to perform functions of a device or circuit according to the invention.

A computer program is a list of instructions such as a particular application program and/or an operating circuit. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer circuit.

The computer program may be stored internally on computer readable storage medium or transmitted to the computer circuit via a computer readable transmission medium. All or some of the computer program may be provided on transitory or non-transitory computer readable media permanently, removably or remotely coupled to an information processing circuit. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating circuit to manage the execution of the process. An operating circuit (OS) is the software that manages the sharing of the resources of a computer and provides programmers with an interface used to access those resources. An operating circuit processes circuit data and user input, and responds by allocating and managing tasks and internal circuit resources as a service to users and programs of the circuit.

The computer circuit may for instance include at least one processing unit, associated memory and a number of input/output (I/O) devices. When executing the computer program, the computer circuit processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

For example, the PMOS and/or NMOS transistors may alternatively arranged by replacing PMOSs with NMOSs and vise-versa.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "electrically coupled" to each other to achieve the desired functionality. Further, "connected in series with" may include other components in between, but also serially connected.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. For example, gate drive circuits 10a-c and 14a-c may include an IC driving one or more IGBTs and may drive both a high and low half of a bridge topology.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A power transistor system comprising;
    a first power transistor;
    a first gate drive circuit comprising a first and second supply capacitor, the first gate drive circuit electrically coupled to the first power transistor;
    a first switch, the first switch electrically coupling a single-supply voltage node with the first supply capacitor of the first gate drive circuit when closed; and
    a control module configured to:
        signal the first switch to close,
        signal the first gate drive circuit to switch on the first power transistor, the first gate drive circuit configured to apply a current supplied by a discharge of the first supply capacitor of the first gate drive circuit to the gate of the first power transistor, and
        signal the first gate drive circuit to switch off, wherein the first gate drive circuit is configured to re-charge the first supply capacitor of the first gate drive circuit by applying a current supplied by a discharge of the respective second supply capacitor to the first capacitor.

2. The power transistor system of claim 1, further comprising;
    a second power transistor;
    a second gate drive circuit comprising a first and second supply capacitor, the second gate drive circuit electrically coupled to the second power transistor;
    a second switch, the first switch electrically coupling the single-supply voltage node with the first supply capacitor of the second gate drive circuit when closed; and
    the control module being further configured to:
        signal a second switch to close, the second switch electrically coupling the single-supply voltage with a first supply capacitor of a second gate drive circuit when closed,
        signal the first gate drive circuit to switch off after signalling the second switch to close,
        signal the second gate drive circuit to switch on the second power transistor, the second gate drive circuit configured to apply a current supplied by a discharge of the first supply capacitor of the second gate drive circuit to the gate of the second power transistor, wherein
            the second supply capacitor of the second gate drive circuit charges using an output signal outputted from the collector of the second power transistor, and
            the second gate drive circuit is configured to re-charge the first supply capacitor of the second gate drive circuit by applying a current supplied by a discharge of the second supply capacitor of the second gate drive circuit to the first capacitor of the second gate drive circuit.

3. The power transistor system of claim 1, wherein
    the first gate drive circuit further comprises a negative transient supply capacitor connected in series with the gate of the first power transistor; and wherein
    the first gate drive circuit is configured to
        charge the negative transient supply capacitor by applying the current supplied by the discharge of the first supply capacitor to the negative transient supply capacitor, and
        switch off the first power transistor by discharging the negative transient supply capacitor.

4. The power transistor system of claim 1, wherein the first gate drive circuit further comprises:
    a diode electrically coupled to the gate of the first power transistor and a third switch, wherein the cathode of the diode is connected to the third switch and the anode is connected to the gate of the first power transistor; and the third switch, the third switch electrically coupling the diode with a ground node.

5. The power transistor system of claim 1, wherein:

the first power transistor is a first IGBT, the second supply capacitor of the first IGBT is electrically coupled to the collector of the first IGBT and the first supply capacitor, and the second supply capacitor of the first IGBT charges using an output signal outputted from the collector of the first IGBT.

6. The power transistor system of claim 2, wherein:

the first power transistor is a first IGBT and the second power transistor is a second IGBT, the second supply capacitor of the first IGBT is electrically coupled to the collector of the first IGBT and charges using an output signal outputted from the collector of the first IGBT, the second supply capacitor of the second IGBT is electrically coupled to the collector of the second IGBT and charges using an output signal outputted from the collector of the second IGBT.

7. The power transistor system of claim 6, wherein the first IGBT is a low-side of the bridge topology and the second IGBT is a high-side of the bridge topology.

8. The power transistor system of claim 1 wherein the single supply voltage is a positive single supply voltage.

* * * * *